(12) United States Patent
Narayanasamy et al.

(10) Patent No.: US 11,689,111 B2
(45) Date of Patent: Jun. 27, 2023

(54) SELF-POWERED SOLID STATE RELAY USING DIGITAL ISOLATORS

(71) Applicant: TEXAS INSTRUMENTS INCORPORATED, Dallas, TX (US)

(72) Inventors: Navaneeth Kumar Narayanasamy, Coimbatore (IN); Manu Balakrishnan, Kollam (IN)

(73) Assignee: Texas Instruments Incorporated, Dallas, TX (US)

(*) Notice: Subject to any disclaimer, the term of this patent is extended or adjusted under 35 U.S.C. 154(b) by 0 days.

(21) Appl. No.: 17/224,456

(22) Filed: Apr. 7, 2021

(65) Prior Publication Data
US 2022/0329168 A1  Oct. 13, 2022

(51) Int. Cl.
| H02M 3/335 | (2006.01) |
| H02M 1/088 | (2006.01) |
| H03K 17/687 | (2006.01) |
| H03K 17/0812 | (2006.01) |
| H03K 17/76 | (2006.01) |

(52) U.S. Cl.
CPC ....... *H02M 3/33571* (2021.05); *H02M 1/088* (2013.01); *H03K 17/08122* (2013.01); *H03K 17/6872* (2013.01); *H03K 17/76* (2013.01)

(58) Field of Classification Search
CPC .......................... H02M 3/33571; H02M 1/088
See application file for complete search history.

(56) References Cited

U.S. PATENT DOCUMENTS

| 3,041,475 A * | 6/1962 | Fisher, Jr. | H03K 17/601 307/406 |
| 3,255,358 A * | 6/1966 | Kilpatrick | H02J 9/062 307/64 |
| 3,286,030 A * | 11/1966 | Puckett | H04L 25/24 331/49 |
| 3,348,130 A * | 10/1967 | Jensen | G05F 1/563 363/25 |
| 3,363,143 A * | 1/1968 | Cavanaugh | H02M 5/2573 361/100 |
| 3,440,433 A * | 4/1969 | Coman | F02K 3/10 290/38 A |
| 3,458,726 A * | 7/1969 | Herron | H03K 17/723 327/462 |
| 3,626,207 A * | 12/1971 | Bartlett | H03K 17/68 327/482 |
| 3,800,166 A * | 3/1974 | Keiner | H04N 9/27 327/489 |
| 3,858,057 A * | 12/1974 | Martins | H03K 17/601 327/587 |
| 3,995,173 A * | 11/1976 | Sibley | H03K 17/601 326/14 |

(Continued)

Primary Examiner — Yusef A Ahmed
(74) Attorney, Agent, or Firm — Valerie M. Davis; Frank D. Cimino

(57) ABSTRACT

A circuit includes a solid-state relay, a rectifier, and a current transformer-based power supply. The rectifier is adapted to be coupled to the solid-state relay. The rectifier is configured to provide a voltage to an output terminal responsive to the solid-state relay being in an off state. The current transformer-based power supply is coupled to the rectifier and is adapted to be coupled to a transformer. The current transformer-based power supply is configured to provide a voltage to the output terminal responsive to the solid-state relay being in an on state.

14 Claims, 7 Drawing Sheets

(56) References Cited

U.S. PATENT DOCUMENTS

| | | | | |
|---|---|---|---|---|
| 4,063,307 A * | 12/1977 | Stephens | H02M 3/33507 | 363/21.16 |
| 4,293,902 A * | 10/1981 | White | H02M 3/3378 | 363/26 |
| 4,356,416 A * | 10/1982 | Weischedel | H03K 17/0414 | 363/134 |
| 4,477,742 A * | 10/1984 | Janutka | H03K 17/6874 | 327/436 |
| 4,500,802 A * | 2/1985 | Janutka | H03K 17/04123 | 327/434 |
| 4,591,734 A * | 5/1986 | Laughton | H03K 17/0406 | 327/170 |
| 4,706,177 A * | 11/1987 | Josephson | H02H 7/1227 | 363/71 |
| 4,763,017 A * | 8/1988 | Campbell | H03K 3/286 | 363/63 |
| 4,859,921 A * | 8/1989 | Archer | H03K 17/567 | 318/599 |
| 4,937,731 A * | 6/1990 | Konopka | H02M 1/10 | 323/346 |
| 5,089,751 A * | 2/1992 | Wong | H05B 41/2981 | 315/307 |
| 5,091,837 A * | 2/1992 | Duspiva | H02M 3/33576 | 363/21.07 |
| 5,122,946 A * | 6/1992 | Taylor | H02M 3/33507 | 363/21.16 |
| 5,272,313 A * | 12/1993 | Karino | H02H 11/007 | 219/130.21 |
| 5,589,891 A * | 12/1996 | McCracken | H02M 1/36 | 348/730 |
| 5,675,276 A * | 10/1997 | Goel | H03K 17/063 | 327/143 |
| 5,862,041 A * | 1/1999 | Martin | H02M 3/33569 | 363/71 |
| 5,939,802 A * | 8/1999 | Hornbeck | H02J 1/10 | 307/64 |
| 6,876,245 B2 * | 4/2005 | de Buda | H03K 17/6877 | 327/427 |
| 9,906,147 B2 * | 2/2018 | Ye | H02M 1/38 | |
| 10,715,047 B1 * | 7/2020 | Chiu | H02M 3/33571 | |
| 2001/0054881 A1 * | 12/2001 | Watanabe | H02M 3/33576 | 320/166 |
| 2003/0007376 A1 * | 1/2003 | Brkovic | H02M 3/3376 | 363/98 |
| 2004/0050377 A1 * | 3/2004 | Cowan | F02P 3/0876 | 123/622 |
| 2005/0068706 A1 * | 3/2005 | Lewis | H02M 5/293 | 361/100 |
| 2007/0024124 A1 * | 2/2007 | Zalmanoff | H03K 17/04123 | 307/116 |
| 2007/0097714 A1 * | 5/2007 | Cebry | H02M 1/38 | 363/21.06 |
| 2007/0103946 A1 * | 5/2007 | Kyono | H02M 3/33592 | 363/21.14 |
| 2007/0133144 A1 * | 6/2007 | Lewis | H03K 17/691 | 361/160 |
| 2013/0194831 A1 * | 8/2013 | Hu | H02M 3/01 | 363/21.01 |
| 2013/0194836 A1 * | 8/2013 | Morris | H02M 1/32 | 363/21.17 |
| 2013/0235620 A1 * | 9/2013 | Morris | H02M 3/335 | 363/21.12 |
| 2013/0271021 A1 * | 10/2013 | Elferich | H05B 45/382 | 315/206 |
| 2015/0084428 A1 * | 3/2015 | Moon | H02J 50/12 | 307/104 |
| 2016/0033979 A1 * | 2/2016 | Teggatz | H03K 17/6871 | 700/298 |
| 2016/0126845 A1 * | 5/2016 | Cohen | H02M 3/33507 | 363/21.01 |
| 2017/0033698 A1 * | 2/2017 | Vemuri | H02M 3/33592 | |
| 2017/0255212 A1 * | 9/2017 | Teggatz | H03K 17/18 | |
| 2018/0183340 A1 * | 6/2018 | Waters | H02J 13/00016 | |
| 2018/0309443 A1 * | 10/2018 | Calabrese | H03K 5/08 | |
| 2021/0119629 A1 * | 4/2021 | Narayanasamy | H03K 17/693 | |

* cited by examiner

US 11,689,111 B2

SELF-POWERED SOLID STATE RELAY USING DIGITAL ISOLATORS

BACKGROUND

Solid-state relays are used in a variety of applications. In one type of application, there may not be a continuous source of power for the circuit that controls the solid-state relay switches. In such example, the control circuit for the solid-state relay may be powered from a voltage generated by a second winding of a transformer and coupled across the switches of the solid-state relay. When the solid-state relay is turned on (e.g., to turn on a motor or other type of load), the voltage across the solid-state relay switches is reduced to approximately zero volts. When that happens, the voltage to power the solid-state relay's control circuit is unavailable. Accordingly, proper functioning of a solid-state relay in such applications is problematic.

SUMMARY

In one example, a circuit includes a solid-state relay, a rectifier, and a current transformer-based power supply. The rectifier is adapted to be coupled to the solid-state relay. The rectifier is configured to provide a voltage to an output terminal responsive to the solid-state relay being in an off state. The current transformer-based power supply is coupled to the rectifier and is adapted to be coupled to a transformer. The current transformer-based power supply is configured to provide a voltage to the output terminal responsive to the solid-state relay being in an on state.

BRIEF DESCRIPTION OF THE DRAWINGS

The same reference number is used in the drawings for the same or similar (either by function and/or structure) features.

DETAILED DESCRIPTION

Figure 1:
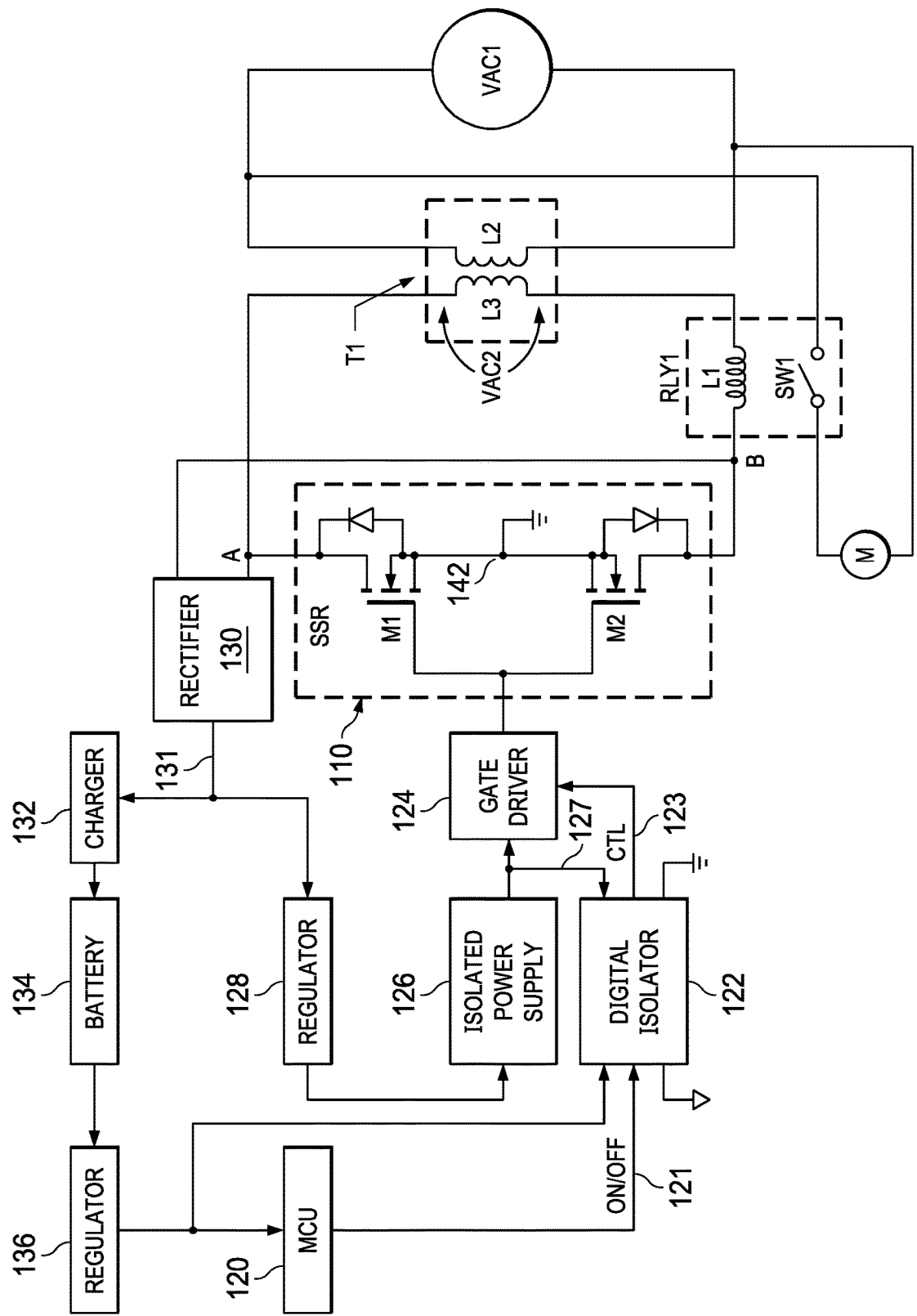
FIG. 1 is a circuit diagram illustrating an example of a circuit that includes a solid-state relay for powering a load such as a motor.

FIG. 1 shows an example of a solid-state relay used to turn on and off a load in a system in which there is no continuously available voltage to power the solid-state relay. Such examples may be characteristic of thermostats used in air conditioning systems or other types of systems. In FIG. 1, motor M may represent a compressor or a fan in an air conditioning system, or another type of load in other systems. The motor M is coupled through a switch SW1 to an alternating current (AC) voltage source VAC1. In one example, VAC1 may be 240 VAC. Switch SW1 is part an electromechanical relay RLY1 that also includes a coil L1. Responsive to a threshold amount of current flowing through coil L1, switch SW1 closes thereby turning on motor M.

FIG. 1 also shows the solid-state relay (SSR) 110, a microcontroller unit (MCU) 120, a digital isolator 122, a gate driver 124, an isolated power supply 126, voltage regulators 128 and 136, a rectifier 130, a battery charger 132, and a battery 134. The SSR 110, MCU 120, the digital isolator 122, the gate driver 124, the isolated power supply 126, the voltage regulators 128 and 136, the rectifier 130, the battery charger 132, and the battery 134 may be completely or partially included in a thermostat. The motor M may be, for example, a compressor or a fan of an air conditioning system in which the thermostat operates. However, numerous other use-cases exist for a solid-state relay.

The SSR 110 includes transistors M1 and M2. In some embodiments where M1 and M2 are implemented using metal-oxide-silicon field effect transistors (MOSFETs), each transistor M1 and M2 has a gate (control input) and a source and drain (a pair of current terminals). In the example of FIG. 1, transistors M1 and M2 comprise N-type MOSFETs (NMOS transistors). The gates of transistors M1 and M2 are coupled together and are coupled to an output of the gate driver 124. The sources of transistors M1 and M2 are coupled together at a terminal 142. Terminal 142 in this example is connected to ground. In other example embodiments, transistors M1 and/or M2 may be implemented using PMOS devices, bipolar transistors, junction transistors or other types of transistors.

The MCU 120 generates an ON/OFF signal 121 that, indirectly, turns the motor M on and off. For example, when the ON/OFF signal is high, the motor turns on, and when the signal is low then the motor turns off. The ON/OFF signal is provided to the digital isolator 122. The digital isolator 122 has two separate voltage suppliers (also referred to as "rails"), each with a different ground, to thereby isolate the control side and the AC supply side of the SSR. The digital isolator 122 responds to an asserted (e.g., high) ON/OFF signal 121 by asserting a control signal (CTL) 123 to the gate driver 124. The gate driver 124 provides a control voltage to the gates of transistors M1 and M2 that is high enough to force the gate-to-source voltage (VGS) of transistors M1 and M2 to exceed their respective threshold voltages and cause the transistors to operate in saturation.

The example of FIG. 1 also shows a voltage transformer T1 comprising a primary winding L2 and a secondary winding L3. The drain of transistor M1 is coupled to one terminal of the secondary winding L3 (labeled terminal A). Coil L1 of the relay RLY1 is coupled between the drain of transistor M2 (labeled terminal B) and the opposing terminal of secondary winding L3. Responsive to the gate driver 124 generating a sufficiently high voltage to turn on both of transistors M1 and M2, current flows through transistors M1 and M2, secondary winding L3, and coil L1 of relay RLY1. Relay RLY1 is configured to cause switch SW1 to close if the current through coil L1 is more than a threshold amount (e.g., more than 1 mA). If no current flows through coil L1, or if less than the threshold amount of current flows through coil L1, the switch SW1 will open and remain open. Accordingly, some current (less than the threshold amount) can flow through coil L1 without activating relay RLY1.

The transformer T1 is a step-down transformer and produces a voltage (VAC2) across its secondary winding L3 that is smaller than the voltage across its primary winding L2

(VAC1). When SSR 110 is in the off state (i.e., transistors M1 and M2 are off), the motor M is off. Further, the voltage difference between terminals A and B (i.e., the voltage difference between the terminals connected to the SSR 110) is approximately equal to VAC2. Accordingly, when the SSR 110 does not cause motor M to be on, the voltage VAC2 is present across terminals A and B.

Terminals A and B are connected to the rectifier 130, which may be a full wave rectifier. The output 131 of rectifier 130 is coupled to the battery charger 132 and to the voltage regulator 128. In one example, voltage regulator 128 is a buck converter, but can be implemented as other types of regulators. The battery charger 132 uses the rectified voltage from rectifier 130 to charge battery 134. The voltage from battery 134 is provided to the voltage regulator 136. The voltage regulator 136 may be a buck/boost converter, or other suitable type of regulator.

The voltage to power the MCU is from the voltage regulator 136. The voltage to power the isolated power supply 126 is from voltage regulator 128. Voltage 127 from the isolated power supply 126 is used to power the isolated side of the digital isolator 122 and the gate driver 124. When the SSR 110 is an off state, voltage VAC2 is available across terminals A and B and is provided to rectifier 130 to directly or indirectly power the MCU 120, the digital isolator 122, and to provide voltage to the isolated power supply 126 to thereby provide a suitable voltage for the gate driver 124.

With the SSR 110 in the off state, some current does flow through coil L1. Current flows through coil L1 and through secondary winding L3, through the rectifier 130 via terminal A, and back to coil L1 via terminal B during one half cycle of VAC2, and in the opposite direction during the other half cycle of VAC2. As long as the magnitude of the current is below the trip point of relay RLY1, switch SW1 will remain open and motor M will not turn on. Using current through coil L1 and the secondary winding L3 when motor M is off works as long as the current is below the trip point of the relay RLY1, otherwise, the relay RLY1 may inadvertently trip thereby turning on the load M (when load M was not intended to be turned on). This current requirement can be a challenge depending on the collective current draw of, for example, the MCU 120, the isolated power supply 126, and the digital isolator 122. Some systems may also include displays (e.g., a display for a thermostat), wireless interfaces, etc., and the current draw of such components may be problematic in terms of adequately powering the circuitry without inadvertently turning on the motor M (which would occur if the current through coil L1 were to exceed the trip point of the relay RLY1).

When the SSR 110 is in the on state (to turn on motor M), terminals A and B are essentially shorted together through serially-connected transistors M1 and M2. In this case, the voltage across terminals A and B becomes approximately 0V, and the voltage to power the MCU 120 and the non-isolated side of the digital isolator 122 is derived from the battery 134 via its voltage regulator 136. However, there is no voltage available to power the isolated power supply 126 to thereby maintain the transistors M1 and M2 in ON states.

As explained above, power from the battery 134 is needed to power at least a portion of the circuitry shown in FIG. 1 (e.g., the MCU 120 and the isolated power supply 126) when a supply voltage between terminals A and B is unavailable due to SSR 110 being on. Unfortunately, battery 134 will be fully drained if the SSR 110 and thus load M remains on for too long of a period of time. The embodiments described below address this problem.

Figure 2:
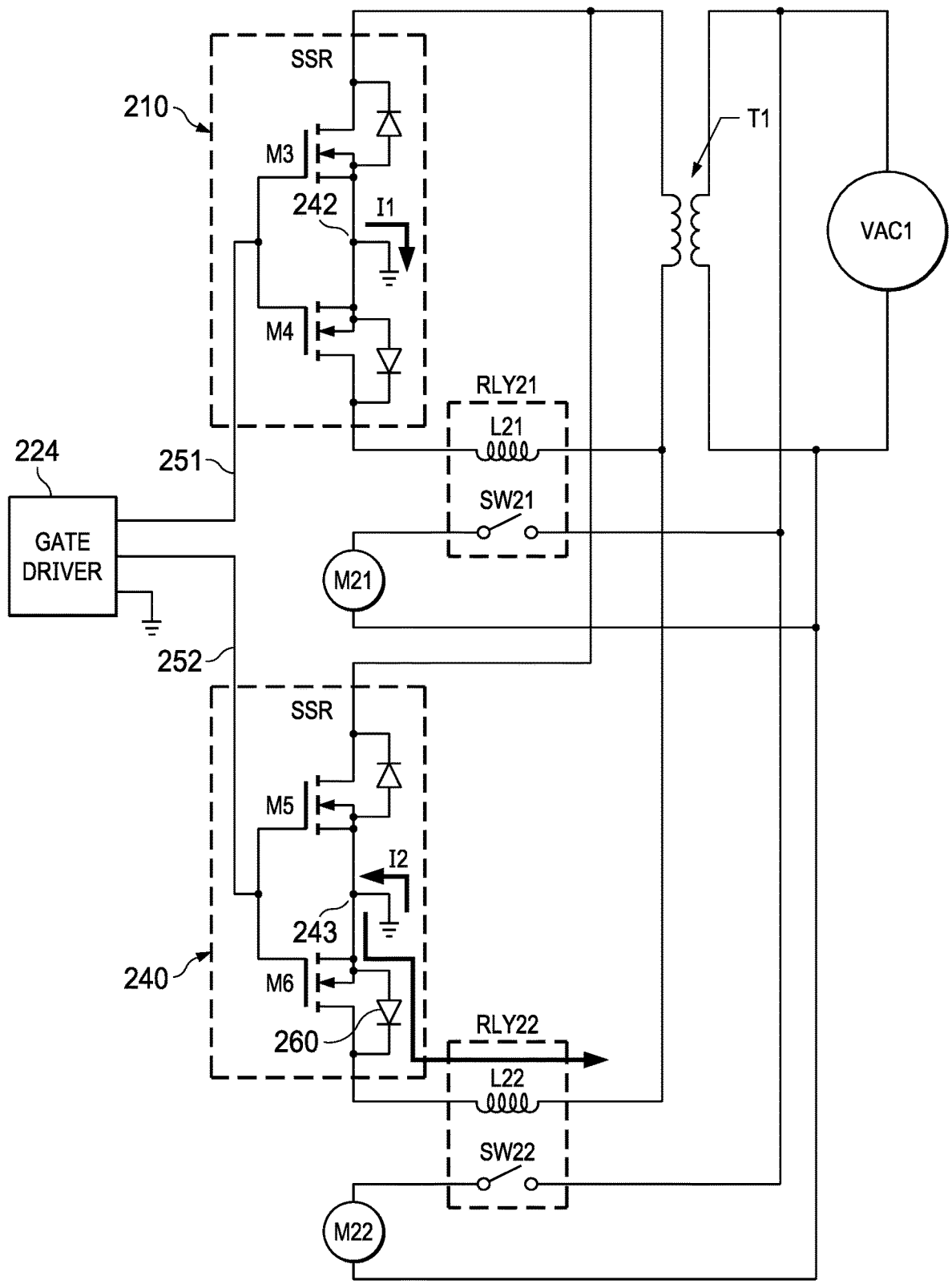
FIG. 2 is a circuit diagram illustrating an example of a circuit that includes multiple solid-state relays for powering multiple respective loads.

FIG. 2 illustrates another problem addressed by the embodiments described below. FIG. 2 illustrates that multiple solid-state relays may be included, each configured to turn on and off a separate load. In the example of FIG. 2, SSR 210 is coupled to relay RLY21 which turns power on and off to motor M21. Similarly, SSR 240 is coupled to relay RLY22 which turns power on and off to motor M22. More than two SSRs and associated electromechanical relays and loads may be provided in other embodiments. The SSR 210 includes serially connected transistors M3 and M4. SSR 240 includes serially connected transistors M5 and M6. Gate driver 224 generates a gate signal 251 to the gates of transistors M3 and M4, and a separate gate signal 252 to the gates of transistors M5 and M6. Gate driver 224 thus can activate either or both of the SSRs 210 and 240. The circuitry that provides a control signal to the gate driver 224 is not shown in FIG. 2 for simplicity.

Because the multiple SSRs 210 and 240 share a single gate driver supply with a common ground, the potential exists for circulating ground currents which may inadvertently turn on a motor that is not intended to be turned on. Assuming SSR 210 is intended to be activated, but not SSR 240, current flows through SSR 210, relay RLY21, and the secondary winding of transformer T1 as described above to thereby power on motor M21. The connection point between transistors M3 and M4 is terminal 242, and the connection point between transistors M5 and M6 is terminal 243. With SSR 210 in an on state, some of the current (designated I1) through transistors M3 and M4 may also flow to ground at terminal 242. Because terminal 243 in SSR 240 is connected to the same ground, some or all of current I1 may flow from ground into node 243 as shown in FIG. 2 as current I2. Current I2 then may flow through the parasitic body diode 260 of transistor M6 and thus through the coil of relay RLY22. If current I2 were to exceed the trip point of relay RLY22, switch SW22 within relay RLY22 may close thereby inadvertently turning on motor M22. At least some of the embodiments described below avoids this problem.

Figure 3:
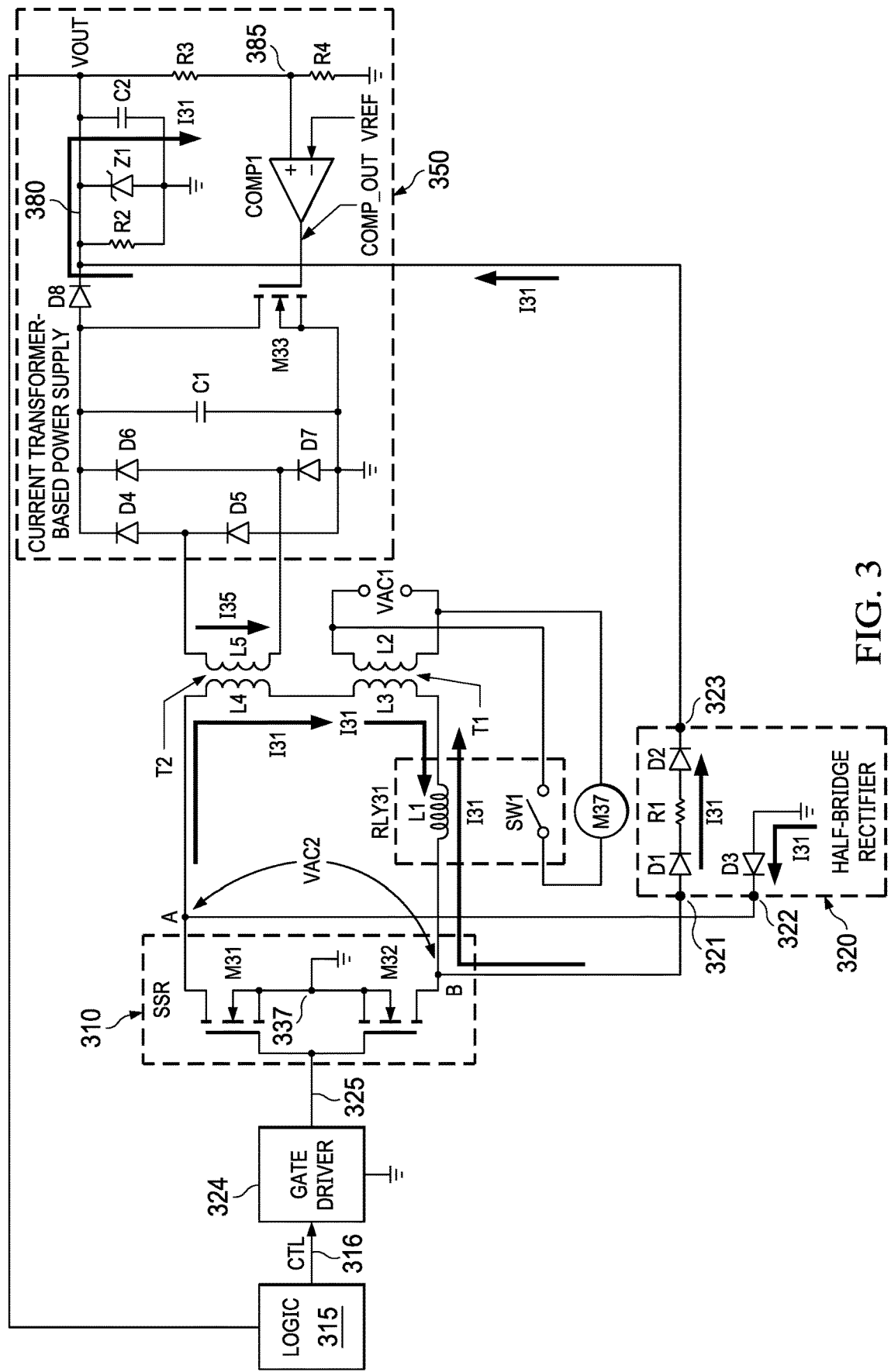
FIG. 3 is a circuit diagram illustrating an example of a circuit including a current-transformer-based power supply and a rectifier to generate an output voltage regardless of whether the solid-state relay is on or off.

FIG. 3 shows an example of an embodiment in which an SSR 310 is coupled to a half-bridge rectifier 320 and to a transformer T2. A current transformer-based power supply 350 is coupled to transformer T2. As will be explained below, the half-bridge rectifier 320 supplies an output voltage to a load responsive to the SSR 310 being in an off state, and the current transformer-based power supply 350 supplies the output voltage (VOUT) to logic 315 (e.g., the MCU 120 and the digital isolator 122 of FIG. 1) responsive to the SSR 310 being in the on state. In either case (SSR 310 being on or off), an output voltage is generated for logic 315. A battery may not be needed with the circuit of FIG. 3. Because the current transformer-based power supply 350 supplies the output voltage to the logic 315 even when the SSR 310 is in the on state, a battery (e.g., battery 134 of FIG. 1) may not be needed. However, a battery can be included as shown in FIG. 1, and the problem described above as to the battery 134 of FIG. 1 potentially being completely depleted due to extended periods of time that the SSR is on is mitigated or eliminated in the embodiment of FIG. 3. Further, in the event of a power outage, a battery may be useful to provide a temporary power source to, for example, save any settings implemented by the MCU 120 (e.g., settings of a thermostat such as programming settings).

FIG. 3 shows logic 315 and a gate driver 324. As noted above, the logic 315 includes, for example, the MCU 120 and the digital isolator 122 of FIG. 1. Other components shown in FIG. 1 may also be included as part of logic 315. The gate driver 324 is coupled to the SSR 310. Logic 315 generates and provides a control signal CTL 316 to the gate driver 324 to cause the gate driver 324 to turn SSR 310 on or off. SSR 310 includes serially connected transistors M31 and M32. The gate signal 325 from the gate driver 324 is coupled to the gates of transistors M31 and M32. FIG. 3 shows a load M37 (e.g., a motor) that is turned on and off through relay RLY31, which is coupled to the drain of transistor M32. The coil L1 of relay RLYL31 is coupled between the secondary winding L3 of transformer T1 and, at terminal B, the drain of transistor M32, as described previously. The primary winding L2 of transformer T1 is coupled to an AC voltage source, VAC1, which may be 120 VAC, 240 VAC, or other AC voltage level. Voltage source VAC1 is also coupled to switch SW1 of relay RLY1 and powers load M37 when the relay is activated by a sufficiently large current flowing through coil L1 so as to cause switch SW1 to be closed. In response to a control signal (not shown in FIG. 3, but shown in FIG. 1), the gate driver 324 asserts the gate signal 325 to cause transistors M31 and M32 to be on thereby causing current to flow through coil L1 of relay RLY31, closing switch SW1, and powering on load M37. When transistors M31 and M32 are not on, no current or an insufficient amount of current flows thorough coil L1, switch SW1 is off, and thus load M37 is off.

Transformer T2 is coupled between the secondary winding L3 of the transformer T1 and the drain of transistor M31 at terminal A. The half-bridge rectifier 320 includes terminals 321, 322, and 323. Terminals 321 and 322 are coupled to terminals B and A, respectively. Terminal 323 is coupled to the output terminal 380 on which an output voltage, VOUT, is generated to power the logic 315.

In the example of FIG. 3, the half-bridge rectifier 320 includes diodes D1, D2, and D3 and resistor R1. The anode of diode D1 is connected to terminal 321 and the cathode of diode D3 is connected to terminal 322. The anode of diode D3 is coupled to ground. The cathode of diode D2 is connected to terminal 323. Resistor R1 is coupled between the cathode of diode D1 and the anode of diode D2. Diode D2 functions to permit the current I31 from the half-bridge rectifier 320 to wire-OR'd with the current from the current transformer-based power supply 350 via diode D8. The resistance of resistor R1 is chosen to limit the current through coil L1 of relay RLY31 to avoid activating the relay (i.e., causing switch SW1 to close) when powering logic 315 but not intending to turn on load M37. In one example, the resistance of resistor R1 is 50 kΩ. The embodiment of FIG. 3 shows that rectifier 320 is a half-wave rectifier. A full wave rectifier can cause circulation current in a multi-SSR circuit, during one half cycle of the AC supply voltage. For example, if there are two SSR circuits (as is the case for FIG. 5 described below), a full wave rectifier can unintentionally turn on a given SSR during one-half cycle of the AC supply, when another SSR is turned on.

The current transformer-based power supply 350 includes diodes D4-D8, Zener diode Z1, capacitors C1 and C2, resistors R2-R4, transistor M33, and comparator COMP1. The transformer T2 includes a primary winding L4 and a secondary winding L5. The primary winding L4 is coupled to the drain of transistor M31 (terminal A) and to the secondary winding L3 of transformer T1. The secondary winding of transformer T2 is coupled to the anode and cathode of diodes D4 and D5, respectively, and to the anode and cathode of diodes D6 and D7, respectively. The cathodes of diodes D4 and D6 are coupled together. The anodes of diode D5 and D7 are coupled together to ground. Capacitor C1 is coupled between the cathodes of diodes D4 and D6 and the anodes of diodes D5 and D7 at ground.

The cathodes of diodes D4 and D6 and capacitor C1 are coupled to the anode of diode D8 and to the drain of transistor M33. The cathode of diode D8 is connected to the output terminal 380. Resistor R2, Zener diode Z1, and capacitor C2 are coupled between the output terminal 380 and ground. As explained above, the output terminal 380 provides the output voltage VOUT used, for example, to power logic 315. Resistors R3 and R4 are connected in series (to form a voltage divider) between the output terminal 380 and ground and provide a scaled VOUT at terminal 385 (between the resistors). Terminal 385 is coupled to the positive input (non-inverting input) of comparator COMP1. A reference voltage VREF is coupled to the negative input (inverting input) of the comparator COMP1. In this example, the output signal COMP_OUT of the comparator COMP1 is logic high when the scaled VOUT on terminal 385 exceeds VREF. The output signal COMP_OUT of the comparator is logic low when the scaled VOUT on terminal 385 is less than VREF. Transistor M33 is an NMOS transistor, in this example embodiment, and is turned on responsive to the comparator's output signal COMP_OUT being logic high, and is turned off when COMP_OUT is logic low.

In operation, when SSR 310 is in an off state (load M37 intended to be off), an AC voltage VAC2 present across L3 (described above) also is present between terminals A and B. During the negative half-cycle of VAC2 (i.e., when the voltage on terminal B is positive with respect to the voltage on terminal A), diodes D1 and D2 are on and current I31 flows from terminal B and through diode D1, resistor R1, and diode D2 to terminal 380. The current I31 then flows from terminal 380 through capacitor C2 to ground, and from ground through diode D3 to terminal A. From terminal A, current I31 flows through windings L4 and L3 and coil L back to terminal B. As long as the magnitude of current I31 is below the trip point for relay RLY31, switch SW1 will not close and thus load M37 will remain off.

When logic 315 asserts the control signal CTL 316 to the gate driver 324 to cause the SSR 310 to be turned on and thus to power on the load M37, the voltage between terminals A and B will fall to approximately zero volts as explained above. In this state (SSR 310 in the on state), the diodes D1-D3 of the half-bridge rectifier 320 will not be conducting and thus the half-bridge rectifier 320 will not contribute to providing VOUT for logic 315. Instead, VOUT is generated from current flowing through transistors M31 and M32. Current I35 flows through the secondary winding L5 of transformer T2. The magnitude of current I35 is:

$$I35 = I31 * \frac{N1}{N2} \tag{1}$$

where N1 is the number of turns in the windings of primary winding L4 and N2 is the number of turns in the windings of secondary winding L5. Current I35 through the secondary winding L5 is thus a function of the current through the primary winding L4.

Diodes D4-D7 are configured as a full wave rectifier and the current I35 will charge the capacitor C1 through the diodes D4-D7. If logic 315 that consumes current is connected to VOUT, then a portion of current I35 will flow to logic 315 through the diode D8 and the rest of current I35 will charge C1. The magnitude of VOUT is the rectified voltage provided to the anode of diode D8 less the voltage drop across diode D8 (e.g., 0.7V). When SSR 310 is in the off state, current I35 is very low and VOUT is dominated by the operation of the half-bridge rectifier 320 as explained above.

As explained above, current I35 through the transformer T2 of the current transformer-based power supply 350 remains at a level that is proportional to current I31. If the resistance of a circuit (e.g., logic 315, which may comprise the MCU 120, the isolated power supply 126, and the digital isolator 122) powered by VOUT is ROUT, then during the steady state:

$$VOUT = I35 * ROUT \qquad (2)$$

If the power draw required by the circuit (e.g., logic 315) is high, then the equivalent ROUT resistance will be low and if the power draw required is low, than the equivalent ROUT resistance will be high. For example, if logic 315 is turned off, or transitions to a sleep mode, ROUT will become high. Per the equation above, unless measures are put in place, VOUT will dramatically and undesirably increase. The comparator COMP1 continuously compares VOUT (through its scaled voltage on terminal 385) to VREF. If VOUT becomes too high (voltage on terminal 385 exceeds VREF), COMP_OUT will be forced high thereby turning on transistor M33. With transistor M33 being on, transistor M33 provides a low resistance path to ground for the current I35 of the secondary winding L3 of transformer T2. The resistance of transistor M33 is the on-resistance of the transistor, and thus per Eq. (2), VOUT will remain at a safely low level.

Figure 4:
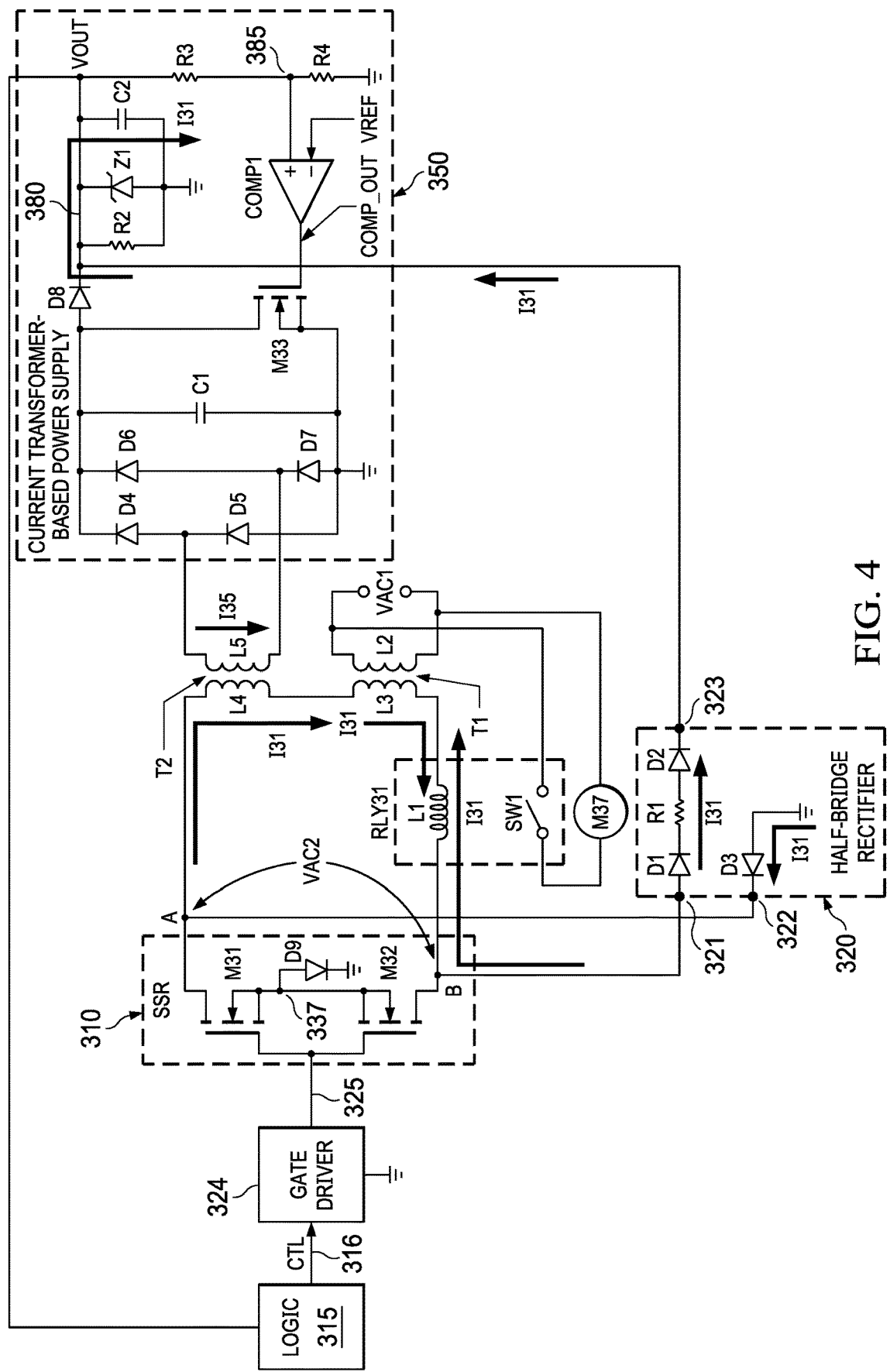
FIG. 4 is a circuit diagram illustrating another example of a circuit including a current-transformer-based power supply and a rectifier.

In FIG. 3, the sources of transistors M31 and M32 are connected together at terminal 337 and to ground as shown. FIG. 4 shows a circuit substantially the same as that of FIG. 3. A difference, however, is that terminal 337 is connected through a diode D9 to ground. The anode of diode D9 is connected to terminal 337 and the diode's cathode is connected to ground. The use of diode D9 is particular helpful if multiple SSRs are included to turn on multiple load, as is discussed below for FIG. 5.

Figure 5:
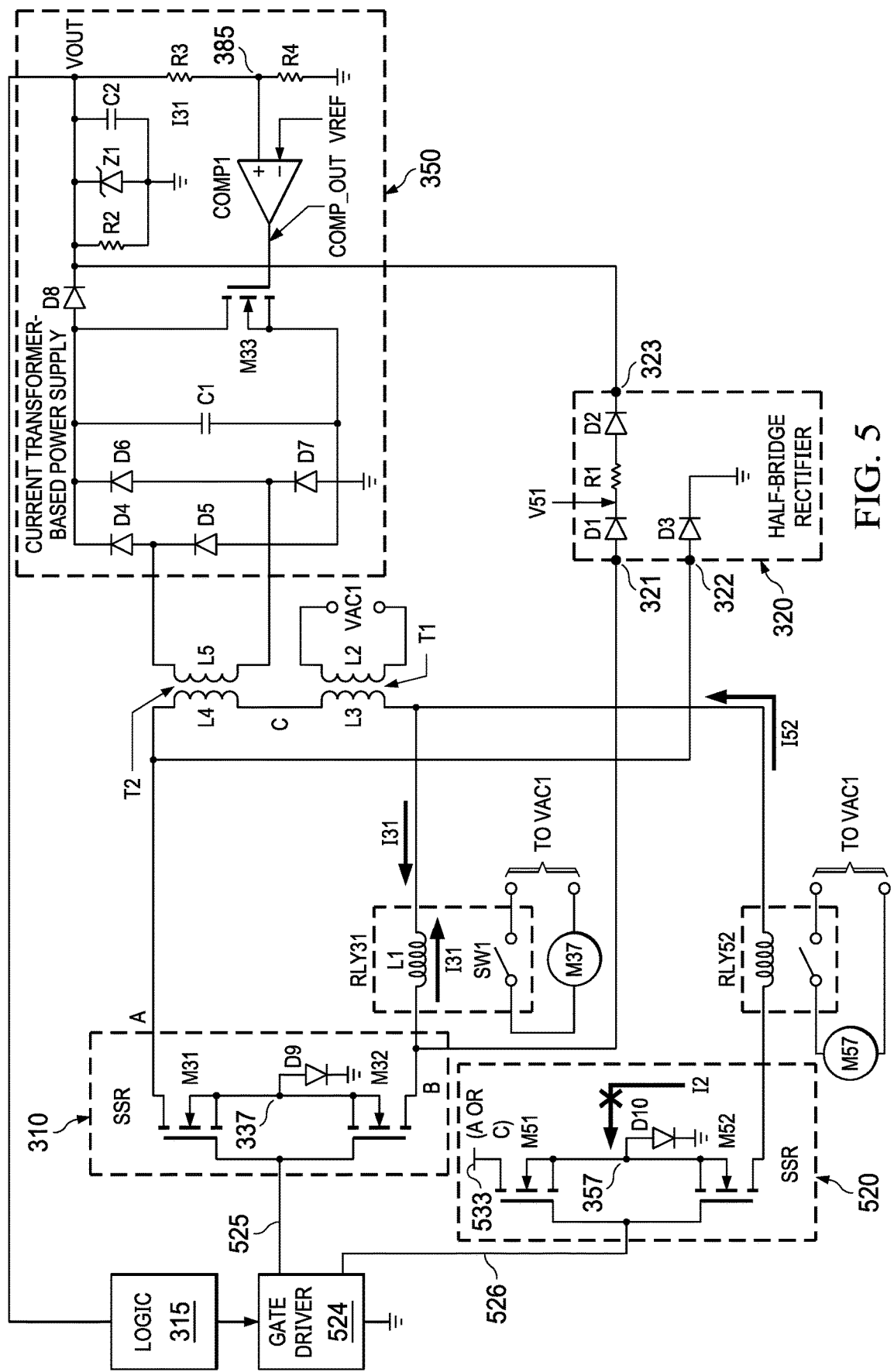
FIG. 5 is a circuit diagram illustrating an example of a circuit including a current-transformer-based power supply and a rectifier and multiple solid-state relays.

FIG. 5 shows an example similar to that of FIG. 4 but with an additional SSR 520. Two SSRS 310 and 520 are shown in the example of FIG. 5, but more than two SSRs can be included as desired. The SSR 310 is used to turn on power to load M37 (e.g. a motor), and SSR 520 is coupled to relay RLY52 to turn on and off load M57 (e.g. a motor). The SSR 520 includes serially connected transistors M51 and M52. A diode D10 is coupled to terminal 357, which is the connection point of the sources of transistors M51 and M52. Like diode D9 of SSR 310, the anode of diode D10 is coupled to terminal 357, and the cathode of diode D10 is coupled to ground.

The gate driver 524 can individually assert control signals 525 and 526, in response to logic 315. Control signal 525 is coupled to the gates of transistors M31 and M32 of the SSR 310. Similarly, control signal 526 is coupled to the gates of transistors M51 and M52 of the SSR 520. The logic 315 can cause either or both of SSRs 310 and 520 to be turned on to thereby provide power to their respective loads M37 and M57. In the example of FIG. 5, the half-bridge rectifier 320 rectifies the current flowing through relay RLY31 (not RLY52). In another example the half-bridge rectifier 320 can be coupled to SSR 510 (instead of SSR 310) to thereby rectify the current flowing through relay RLY52. FIG. 5 shows that the current transformer-based power supply 350 is coupled to SSR 310 and SSR 520. In yet another example, one current transformer-based power supply can be coupled to SSR 310, and another current transformer-based power supply can be coupled to SSR 520.

In FIG. 5, the drain of transistor M31 is coupled to the transformer T2 at node A. The drain 533 of transistor M51 can be coupled to either terminal A (and thus to the drain of transistor M31) or to the opposing terminal of the primary winding L4 (terminal C). If the drain of transistor M51 is coupled to terminal A, then the current flowing through primary winding L4 is the sum of the currents through SSRs 310 and 510. If the drain of transistor M51 is coupled instead to terminal C, then the current flowing through primary winding L4 is only the current through SSR 310. In the latter case, power to the current transformer-based power supply 350 is supplied from only one SSR (e.g., SSR 310) when that SSR is on. To the extent that more than two SSRs are included, the drain of the corresponding transistor of each such additional SSR also can be connected to either terminal A or terminal C so that the current through the transformer T2 to generate power can be from one or more SSRs.

The problem explained above in which a relay can unintentionally be activated by a ground current stemming from multiple SSRS sharing a common ground is avoided in the embodiment of FIG. 5 through the use of diodes D9 and D10—diodes that function as blocking diodes. For example, if logic 315 causes the gate driver 524 to generate the control signals 525 and 526 such that SSR 310 is to be in an on state and SSR 520 is to be in an off state, diode D10 will block any potential ground current (see e.g., current I2 in FIG. 2) from flowing from ground to terminal 357 in SSR 520. That diode D10 functions as a blocking diode is illustrated in FIG. 5 by a dashed arrow representation of current I2 with an "X" through it.

The single SSR embodiment of FIG. 3 illustrates that terminal 337 is connected to ground, not to a blocking diode. In embodiments in which there is only one SSR, there is no possibility of ground current of one SSR to inadvertently cause another SSR to be turned on, and thus a blocking diode is not needed. However, if desired, a diode can be connected to the connection point between the transistors of an SSR, as is shown in FIG. 4. Further, even in the context of multiple SSRs, blocking diodes may not be included as desired (e.g., if the potential for a ground current to turn on an SSR is sufficiently low).

Figure 6:
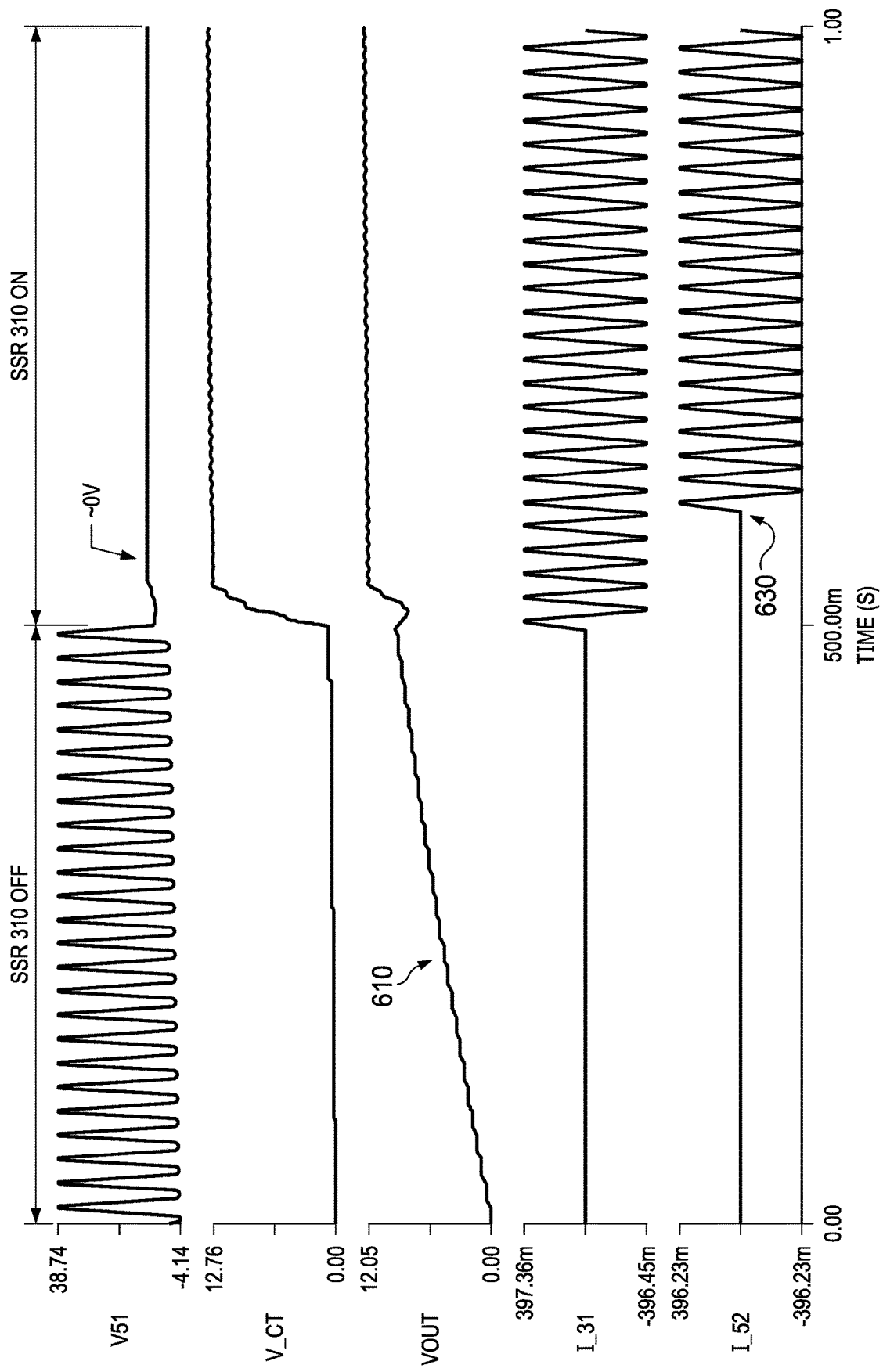
FIG. 6 are voltage or current versus time graphs illustrating an example of signal waveforms pertaining to the example circuit of FIG. 5.

FIG. 6 illustrates several waveforms identified in FIG. 5. The waveforms shown in FIG. 6 are for the voltage on the cathode of diode D1 within the half-bridge rectifier 320 (i.e., voltage V51), the voltage V_CT provided by the current transformer-based power supply 350 to the anode of diode D8, VOUT, the current I_31 through relay RLY31, and the current I_52 through relay RLY52.

Voltage V51 is the half wave rectified voltage difference between terminals A and B, and is present while SSR 310 is in the off state. Voltage V51 becomes approximately 0 V as shown when SSR 310 is turned on. Voltage V_CT is approximately 0 V when SSR 310 is off and increases to approximately 12.76 V in this example when SSR 310 is turned on. At a power on event, VOUT is initially 0 V level and increases as shown at 610 as current flows through the half-bridge rectifier 320 and charges capacitor C2. Upon SSR 310 being turned on to power on load M37, VOUT is supported at approximately 12 V in this example by the current transformer-based power supply 350 and current I_31 oscillates sinusoidally as shown. At 630, the logic 315 also causes SSR 520 to be turned on and current I_52 begins to oscillate as well as load M57 is powered on.

In the embodiments described herein, when an SSR is turned on, current flows to a relay to thereby turn on a load (e.g., a motor) coupled to the relay. The relay includes an inductor as shown in the FIGS. 1-5 (inductors L1, L21, and L22). The voltage induced across an inductor as a result of current flowing through it is a function of the rate of change of current over time $$\left(V = L * \frac{di}{dt}\right),$$

where V is the voltage across the inductor, L is the inductance of the inductor, and di/dt is the rate of change of current through the inductor. The larger the rate of change of inductor current, the larger will be the induced voltage across the inductor. If the SSR is turned off when non-zero current is flowing the SSR and thus through the inductor of the relay coupled to the SSR, a relatively high voltage will be induced across the inductor (sometimes referred to as the inductive kick-back voltage). The inductive kick-back voltage will appear as a large voltage spike which may damage the transistors of the SSR.

Figure 7:
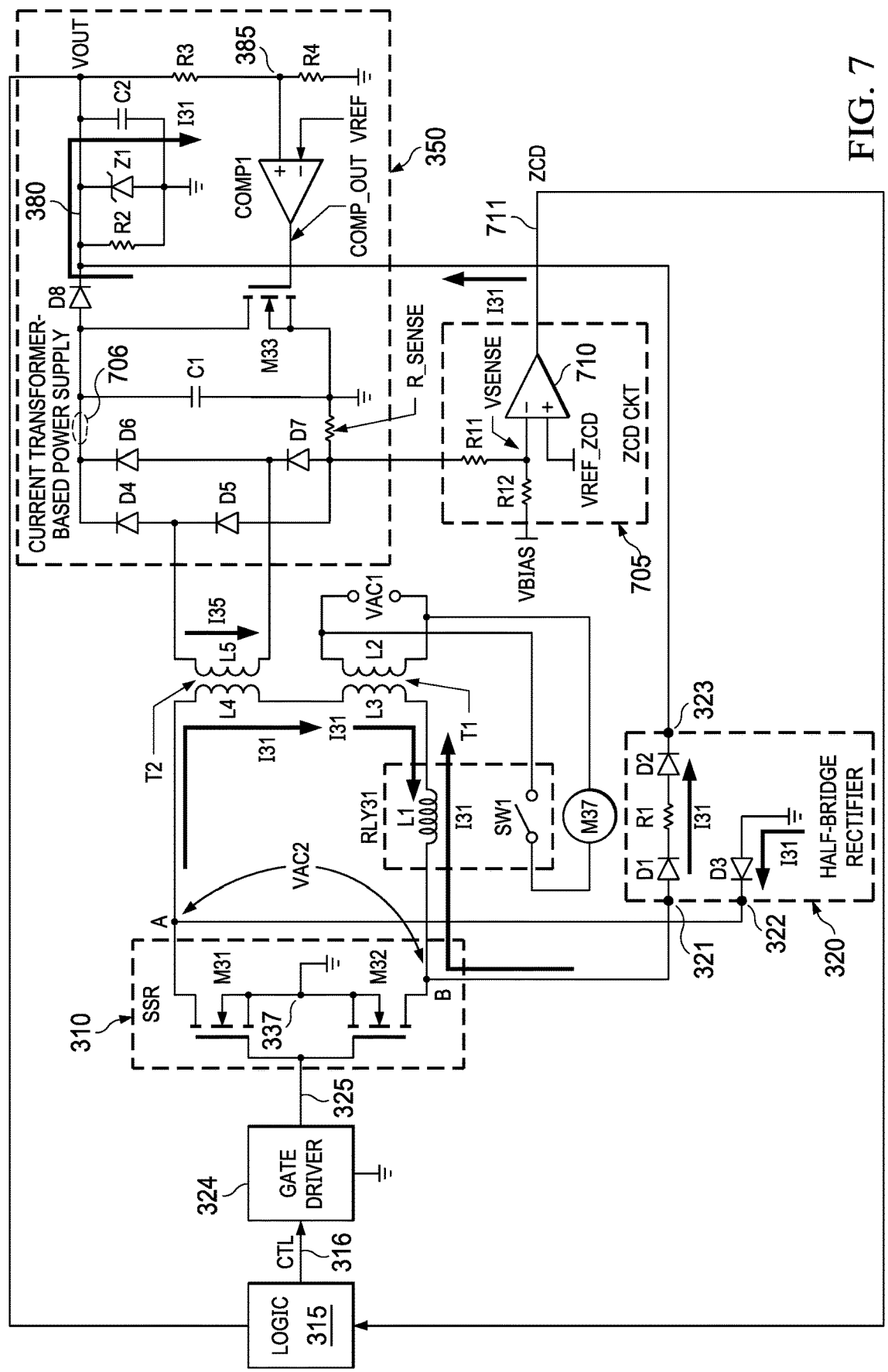
FIG. 7 is a circuit diagram illustrating an embodiment in which a zero-crossing detection circuit is included.

FIG. 7 shows an example similar to FIG. 3 but with the addition of a zero-crossing detection (ZCD) circuit 705. The ZCD circuit 705 when the current through relay RLY31 is approximately 0 A and responds by asserting (e.g., logic low) an output ZCD signal 711 to logic 315. When the logic 315 determines that it should turn off SSR 310, it does so when the ZCD signal 711 is asserted to a state indicative of approximately zero current (approximately, 0 A) through relay RLY31. Any of the embodiments described herein (e.g., the embodiments of FIGS. 1-5) can include a ZCD circuit 705.

In the example of FIG. 7, a sense resistor, R_SENSE, is coupled between ground and the common anode connection of diodes D5 and D7. The sense resistor R_SENSE is a relatively small resistance (e.g., 1 ohm) that generates a voltage proportional to the current through the secondary winding L5 of the current transformer T2. The current through inductor L1 also is the current through the primary winding L4 of transformer T2. The instance in time when there is approximately zero current through inductor L1 and primary winding L4 can be detected by detecting when the current through the secondary winding L5 is approximately 0 A. The phase displacement of the current between the primary and second windings L4 and L5 is approximately 180 degrees and thus the zero-crossing point occurs at approximately the same point in time for the current in the primary winding and the secondary winding.

In the example of FIG. 7, the ZCD circuit 705 includes an operational amplifier (op-amp) 710 (functioning as a comparator) and resistors R11 and R12. The voltage across resistor R_SENSE is coupled via resistor R11 to the inverting input of op-amp 710. A reference voltage, VREC_ZCD, is coupled to the non-inverting input of op-amp 710. A bias voltage, VBIAS, is coupled through resistor R12 to the inverting input. The voltage on the inverting input is VSENSE. When the current through resistor RSENSE is zero amperes, there will be no potential difference across resistor RSENSE and thus the voltage on the anodes of diode D7 (which is voltage on the left-hand terminal of resistor RSENSE) will be 0 V. At that point, VSENSE will be equal to $$VBIAS * \frac{R11}{R11 + R12},$$

and this voltage will be provided to the inverting input of op-amp 710.

Accordingly, at the moment of the zero-crossing current, $$VSENSE = VBIAS * \frac{R11}{R11 + R12}.$$

In one embodiment, VREF_ZCD is set to a value that that is slightly less than $$VBIAS * \frac{R11}{R11 + R12},$$

When the zero-crossing event for the relay current occurs, VREF_ZCD on the non-inverting input of op-amp 710 will become less than VSENSE on the inverting input of op-amp 710 thereby causing the op-amp 710 to force the ZCD signal on its output to a logic low level.

The sense resistor, RSENSE, can be placed in other locations as well. For example, resistor RSENSE can be coupled between the common cathode terminals of diodes D4 and D6 and the upper terminal of capacitor C1 (see dashed outline 706 indicating this location).

In this description, the term "couple" may cover connections, communications, or signal paths that enable a functional relationship consistent with this description. For example, if device A generates a signal to control device B to perform an action: (a) in a first example, device A is coupled to device B by direct connection; or (b) in a second example, device A is coupled to device B through intervening component C if intervening component C does not alter the functional relationship between device A and device B, such that device B is controlled by device A via the control signal generated by device A.

A device that is "configured to" perform a task or function may be configured (e.g., programmed and/or hardwired) at a time of manufacturing by a manufacturer to perform the function and/or may be configurable (or re-configurable) by a user after manufacturing to perform the function and/or other additional or alternative functions. The configuring may be through firmware and/or software programming of the device, through a construction and/or layout of hardware components and interconnections of the device, or a combination thereof.

As used herein, the terms "terminal", "node", "interconnection", "pin" and "lead" are used interchangeably. Unless specifically stated to the contrary, these terms are generally used to mean an interconnection between or a terminus of a device element, a circuit element, an integrated circuit, a device or other electronics or semiconductor component.

A circuit or device that is described herein as including certain components may instead be adapted to be coupled to those components to form the described circuitry or device. For example, a structure described as including one or more semiconductor elements (such as transistors), one or more passive elements (such as resistors, capacitors, and/or inductors), and/or one or more sources (such as voltage and/or current sources) may instead include only the semiconductor elements within a single physical device (e.g., a semiconductor die and/or integrated circuit (IC) package) and may be adapted to be coupled to at least some of the passive elements and/or the sources to form the described structure either at a time of manufacture or after a time of manufacture, for example, by an end-user and/or a third-party.

While the use of particular transistors is described herein, other transistors (or equivalent devices) may be used instead. For example, a p-type metal-oxide-silicon FET ("MOSFET") may be used in place of an n-type MOSFET with little or no changes to the circuit. Furthermore, other types of transistors may be used (such as bipolar junction transistors (BJTs)).

Circuits described herein are reconfigurable to include the replaced components to provide functionality at least partially similar to functionality available prior to the component replacement. Components shown as resistors, unless otherwise stated, are generally representative of any one or more elements coupled in series and/or parallel to provide an amount of impedance represented by the shown resistor. For example, a resistor or capacitor shown and described herein as a single component may instead be multiple resistors or capacitors, respectively, coupled in parallel between the same nodes. For example, a resistor or capacitor shown and described herein as a single component may instead be multiple resistors or capacitors, respectively, coupled in series between the same two nodes as the single resistor or capacitor.

Uses of the phrase "ground" in the foregoing description include a chassis ground, an Earth ground, a floating ground, a virtual ground, a digital ground, a common ground, and/or any other form of ground connection applicable to, or suitable for, the teachings of this description. Unless otherwise stated, "about," "approximately," or "substantially" preceding a value means +/−10 percent of the stated value. Modifications are possible in the described examples, and other examples are possible within the scope of the claims.

Modifications are possible in the described embodiments, and other embodiments are possible, within the scope of the claims.

What is claimed is:

1. A circuit comprising:
an output terminal;
a solid-state relay (SSR) having first and second outputs configured to be coupled to a transformer;
a rectifier having an output, and first and second inputs respectively coupled to the first and second outputs of the solid-state relay, the rectifier configured to provide a first voltage to the output terminal responsive to the solid-state relay being in an off state;
a current transformer-based power supply having an input coupled to the output of the rectifier, the current transformer-based power supply configured to be coupled to the transformer, the current transformer-based power supply configured to provide a second voltage to the output terminal responsive to the solid-state relay being in an on state, wherein the rectifier is configured to deliver a current from the output of the rectifier to the input of the current transformer-based power supply to provide the second voltage to the output terminal responsive to the solid-state relay being in the on state, the second voltage being proportional to the current delivered; and
control circuitry having an input and an output, the input of the control circuitry coupled to the output terminal and the output of the control circuitry coupled to the SSR, the control circuitry configured to control the SSR.

2. The circuit of claim 1, wherein the rectifier is a half wave rectifier.

3. The circuit of claim 1, wherein the current transformer-based power supply includes:

a transistor coupled to the output terminal, the transistor having a control input; and
a comparator having first and second inputs and an output, the output of the comparator is coupled to the control input of the transistor.

4. The circuit of claim 3, wherein the first input of the comparator is coupled to the output terminal, and the second input of the comparator is coupled to a reference voltage source.

5. The circuit of claim 3, wherein the comparator is configured to turn on the transistor responsive to the second voltage on the output terminal exceeding a threshold.

6. The circuit of claim 1, wherein the SSR is a first SSR and the circuit includes a second SSR, the second SSR is adapted to be coupled to the transformer.

7. The circuit of claim 6, wherein the transformer includes a first terminal and a second terminal, the first terminal is adapted to be coupled to the first SSR, and the second terminal is adapted to be coupled to the second SSR.

8. The circuit of claim 6, wherein the transformer includes a first terminal and a second terminal, the first terminal is adapted to be coupled to the first SSR and to the second SSR.

9. The circuit of claim 1, further including a zero-crossing detection circuit coupled to the current transformer-based power supply, the zero-crossing detection circuit configured to detect when current through the transformer is approximately zero amperes.

10. A circuit comprising:
an output terminal;
a solid-state relay (SSR) having first and second outputs configured to be coupled to a transformer, wherein the solid-state relay includes:
a first transistor having first and second current terminals;
a diode; and
a second transistor having first and second current terminals, the second current terminals of the first and second transistors coupled together, wherein the diode is coupled between the second current terminals of the first and second transistors and ground;
a rectifier having an output, and first and second inputs respectively coupled to the first and second outputs of the SSR, the rectifier configured to provide a first voltage to the output terminal responsive to the SSR being in an off state;
a current transformer-based power supply having an input coupled to the output of the rectifier, the current transformer-based power supply configured to be coupled to the transformer, the current transformer-based power supply configured to provide a second voltage to the output terminal responsive to the SSR being in an on state; and
control circuitry having an input and an output, the input of the control circuitry coupled to the output terminal and the output of the control circuitry coupled to the SSR, the control circuitry configured to control the SSR.

11. A circuit comprising:
an output terminal;
a solid-state relay (SSR) having first and second terminals, wherein the SSR includes:
a first transistor having first and second current terminals; and
a second transistor having first and second current terminals, the second current terminals of the first and second transistors coupled together and to an anode of a diode;

a half-bridge rectifier having a rectifier output, the half-bridge rectifier configured to be operably coupled to the first and second terminals of the SSR to provide a first voltage on the rectifier output responsive to the solid-state relay being in an off state;

a transformer adapted to be operably coupled to the first and second terminals of the solid-state relay responsive to the solid-state relay being in an on state; and a current transformer-based power supply coupled to the rectifier output and to the transformer, the current transformer-based power supply is configured to:

generate a second voltage for the output terminal responsive to the solid-state relay being in the on state using a current through a secondary winding of the transformer; and provide the first voltage to the output terminal responsive to the solid-state relay being in the off state and using a current output from the rectifier output, wherein the current transformer-based power supply includes:

a transistor coupled to the output terminal, the transistor having a control input; and a comparator having first and second inputs and an output, the output of the comparator is coupled to the control input of the transistor, wherein the first input of the comparator is coupled to the output terminal, and the second input of the comparator is configured to be coupled to a reference voltage source, and wherein the comparator is configured to control the transistor responsive to a comparison of the second voltage on the output terminal to a threshold set by the reference voltage source.

12. The circuit of claim 11, wherein the circuit is at least a portion of a thermostat.

13. The circuit of claim 11, further comprising control circuitry having an input and an output, the input of the control circuitry coupled to the output terminal and the output of the control circuitry coupled to the SSR, the control circuitry configured to control the SSR.

14. The circuit of claim 11, wherein the half-bridge rectifier is configured to deliver a current from the output of the half-bridge rectifier to an input of the current transformer-based power supply to provide the second voltage to the output terminal responsive to the solid-state relay being in the on state, the second voltage being proportional to the current delivered.

* * * * *